United States Patent [19]

Lee et al.

[11] Patent Number: 5,689,464
[45] Date of Patent: Nov. 18, 1997

[54] COLUMN REPAIR CIRCUIT FOR INTEGRATED CIRCUITS

[75] Inventors: Jong Seuk Lee; Seung Min Kim; Jae Hyeoung Kim; Sang Ho Lee, all of Seoul, Rep. of Korea

[73] Assignee: Hyundai Electronics Industries Co., Ichonkun Kyoungkido, Rep. of Korea

[21] Appl. No.: 600,599

[22] Filed: Apr. 19, 1994

Related U.S. Application Data

[63] Continuation of Ser. No. 701,528, May 16, 1991, abandoned.

[30] Foreign Application Priority Data

May 18, 1990 [KR] Rep. of Korea .................. 1990-7170

[51] Int. Cl.$^6$ ............................................. G11C 7/00
[52] U.S. Cl. .............................................. 365/200; 371/10.3
[58] Field of Search ................................. 365/200, 201; 371/10.3, 10.2; 307/202.1, 451

[56] References Cited

U.S. PATENT DOCUMENTS

| 4,606,013 | 8/1986 | Yoshimoto | 365/200 |
| 4,791,319 | 12/1988 | Tagami et al. | 307/202.1 |
| 4,829,481 | 5/1989 | Johnson et al. | 365/200 |
| 5,134,585 | 7/1992 | Murakami et al. | 371/10.3 |
| 5,146,429 | 9/1992 | Kawai et al. | 365/200 |

*Primary Examiner*—Tan Dinh
*Attorney, Agent, or Firm*—Darby & Darby

[57] ABSTRACT

A column repair circuit for a semiconductor memory having an input/output selection circuit for inputting a control signal, selecting a bit line and a bit bar line corresponding to a faulty memory cell and replacing the selected bit line and bit bar line with a spare bit line and a spare bit bar line. The input/output selection circuit includes an input stage for inputting the control signal, a spare bit line and a spare bit bar line, and a plurality of fuses each having one side connected to the input stage and other side connected to a plurality of resistors. The other side of the resistors are connected to ground for outputting the output signals. The input/output selection circuit further has a plurality of n-channel MOSFETs each including a gate connected to each of the other stages of the plurality of fuses via the resistors in a 2 to 1 manner for inputting the output signals. The drains of the MOSFETS are connected to the spare bit line and spare bit bar line and their sources are connected to each of the plurality of data bit lines and the plurality of data bit bar lines for functioning as a switch. Therefore, the present invention can provide the column repair circuit for a semiconductor memory which is capable of increasing its repair yield by adding the input/output selecting circuit enabling input/output selecting.

4 Claims, 3 Drawing Sheets

COLUMN REPAIR CIRCUIT FOR INTEGRATED CIRCUITS

This is a continuation of application Ser. No. 7/701,528, filed May 16, 1991.

BACKGROUND OF THE INVENTION

1. Field of the Invention

The present invention relates generally to a column repair circuit for integrated circuits, and more particularly to a column repair circuit for a byte-wide SRAM in which information can be sent out over 8 bit lines selected simultaneously by addresses through 8 input/output pads, without use of fuse in a decoder means.

2. Description of the Prior Art

Referring to FIG. 1, a conventional decoder means for a static random access memory (SRAM) is shown to comprise an inverter G0 for inputting addresses, a fuse F1 and a pair of MOSFETs T1 and T2. One stage of the fuse F1 is connected to an output terminal of the inverter G0 and other stage thereof is connected to a ground via a resistor R1. Also, the other stage of the fuse F1 is connected to a gate input stage consisting of gates of the MOSFETs T1 and T2. On the other hand, respective drains and sources of the MOSFETs T1 and T2 are adapted to connect a data bit line DB and a data bit bar line DBB to a bit line and a bit bar line respectively.

Now, the operation of the above-mentioned conventional decoder means for SRAM will be described.

If a memory cell connected to the bit line and bit bar line malfunctions, the fuse F1 in decoder means is cut to stop the normal operation of the decoder means, thereby resulting in stopping the operation of the malfunction bit line and bit bar line. Once the fuse F1 is cut, a node A in the gate input stage of the MOSFETs T1 and T2 is made a low level by the resistor R1 of which one stage is connected to the ground. Therefore, information over the bit line and bit bar line can not be sent out over the data bit line DB and data bit bar line DBB.

In the conventional decoder means as mentioned above, however, when information is inputted and outputted simultaneously through 8 input/output pads I/O1 to I/O8, then 8 bit lines and 8 bit bar lines are selected simultaneously by addresses and each of the 8 bit lines and 8 bit bar lines is connected to each of 8 input/output pads I/O1 to I/O8. Therefore, although a memory cell of address for certain input/output pad malfunctions, while memory cells of addresses for remaining 7 input/output pads are normal, the 8 bit lines and 8 bit bar lines should be replaced by 8 spare columns.

In result, in the conventional decoder means, the 8 bit lines and 8 bit bar lines have no choice but to be replaced by the 8 spare columns without input/output selection, thereby resulting in degradation of the repair yield thereof and the laser cutting of fuse in spite of small size of integrated circuits.

SUMMARY OF THE INVENTION

Therefore, it is an object of the present invention to provide a column repair circuit for integrated circuits which is capable of increasing its repair yield by adding an input/output select means enabling input/output selection, without use of fuse.

In accordance with the present invention, the object can be accomplished by providing a column repair circuit for SRAM comprising: an input/output means adapted for inputting a control signal, selecting a bit line and a bit bar line corresponding to a malfunction address and replacing said selected bit line and bit bar line with a spare bit line and a spare bit bar line; and a decoder means adapted for inputting output signals from said input/output means and addresses, selecting one of a plurality of bit lines and one of a plurality of bit bar lines in response to said inputted output signals from said input/output means and addresses, sending information over said selected one bit line and one bit bar line out to one of a plurality of data bit lines and one of a plurality of data bit bar lines.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF PREFERRED EMBODIMENTS

Figure 1:
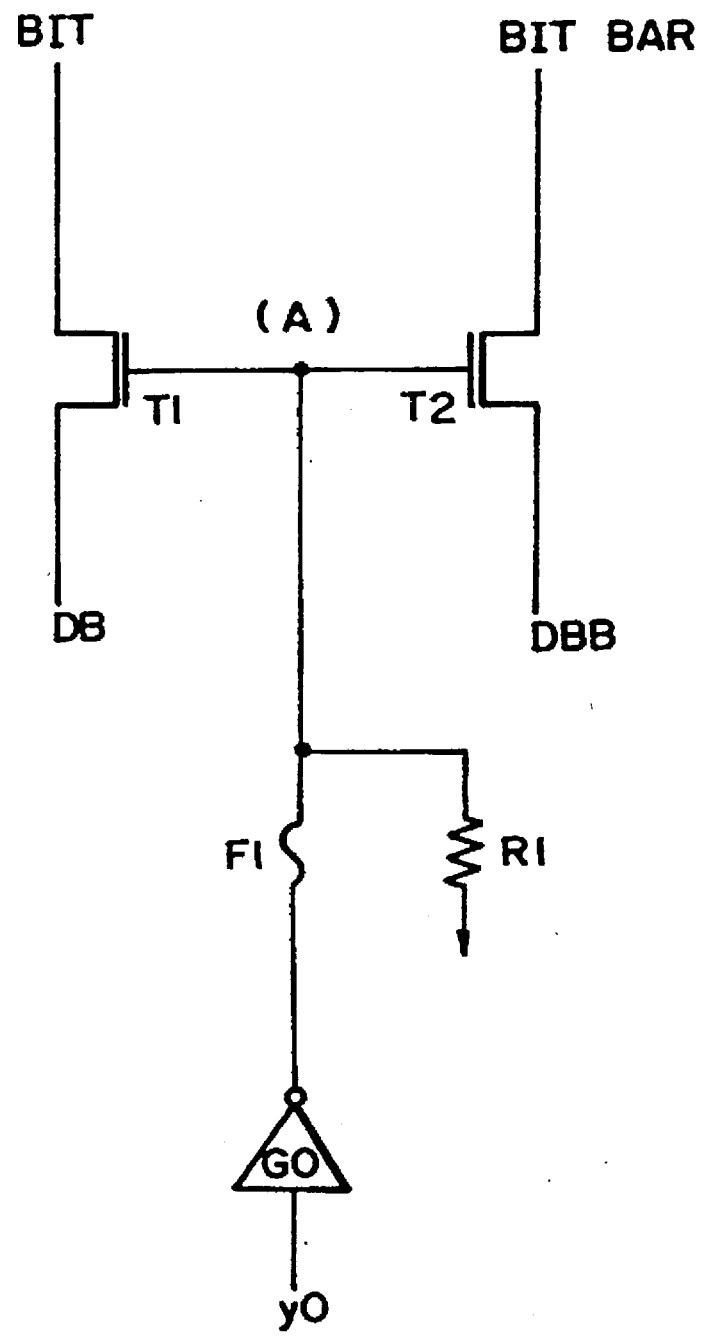
FIG. 1 is a schematic diagram of a conventional column repair circuit.
Figure 2A:
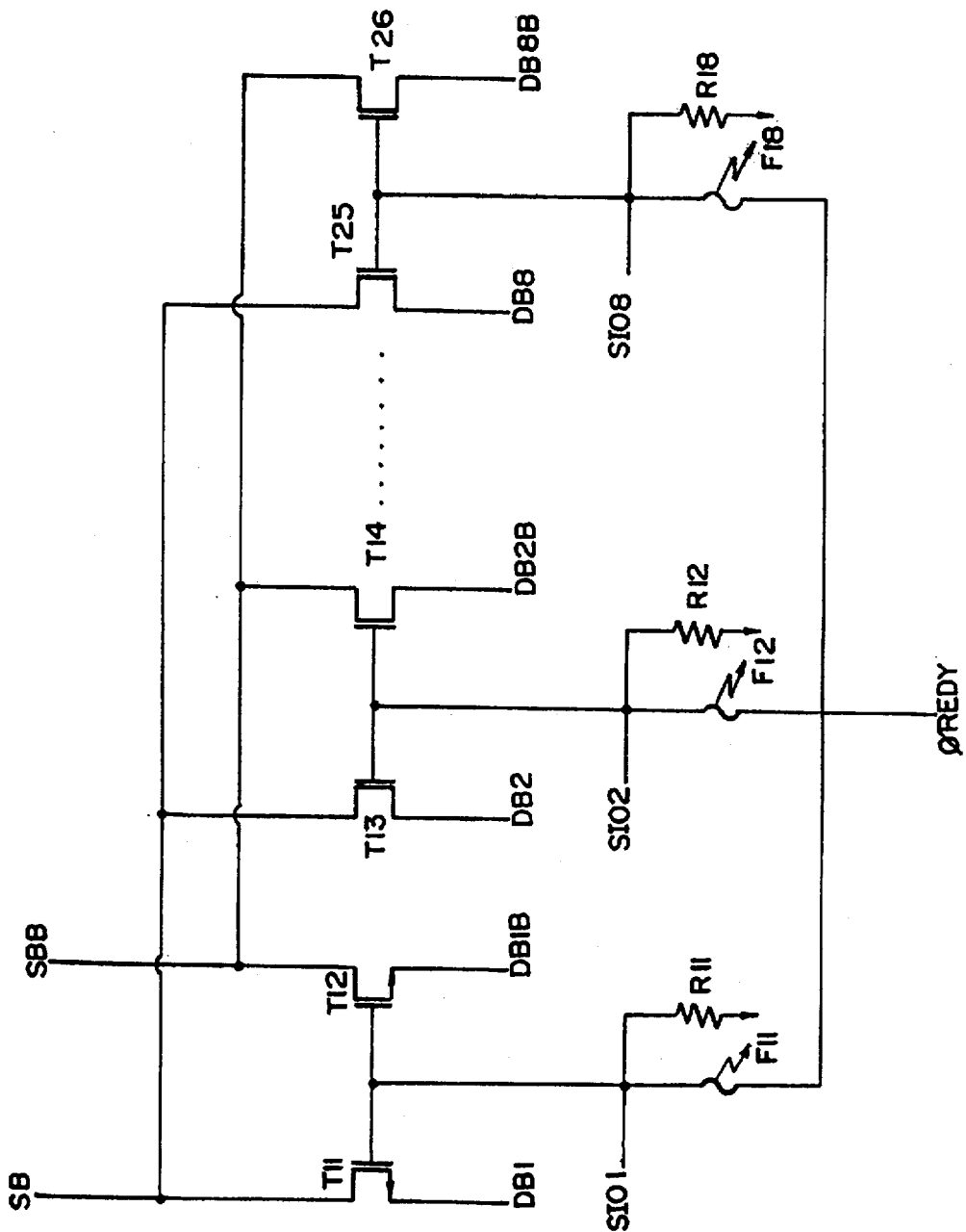
FIG. 2a is a schematic diagram of an input/output select means in a column repair circuit in accordance with the present invention.
Figure 2B:
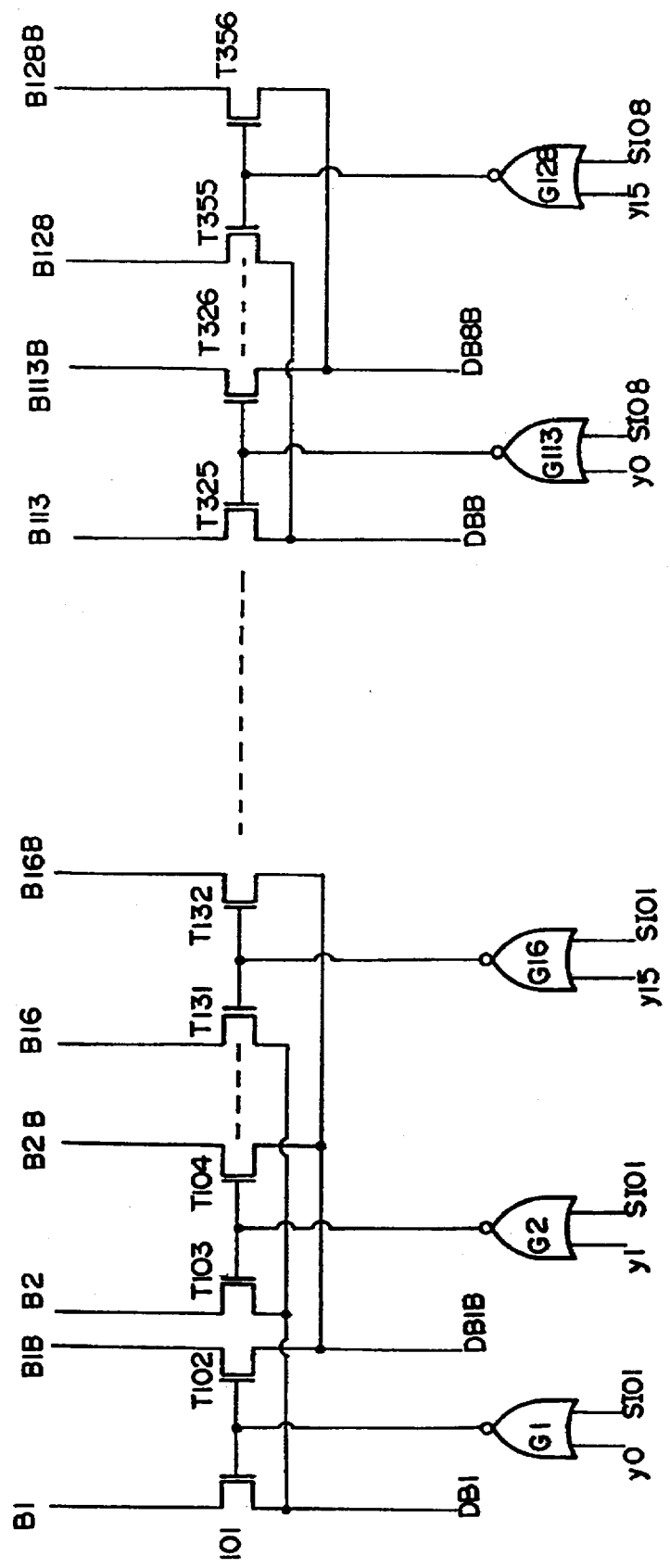
FIG. 2b is a schematic diagram of a decoder means in the column repair circuit in accordance with the present invention.

FIGS. 2a and 2b show schematic diagrams of an input/output select means and a decoder means in a column repair circuit in accordance with the present invention, respectively. In these drawings, the reference numerals G1 to G128 designate NOR gates, F11 to F18 fuses, R11 to R18 resistors, and T11 to T26 and T101 to T356 n-channel MOSFETs.

First, a construction of a column repair circuit in accordance with the present invention will be described with reference to FIGS. 2a and 2b.

The column repair circuit of the present invention comprises an input/output select means and a decoder means.

Referring now to FIG. 2a, the input/output select means in the column repair circuit in accordance with the present invention is shown to comprise an input stage adapted for inputting a control signal $\phi$REDY and a plurality of fuses F11 to F18 of which each of one stages is connected to the input stage. On the other hand, each of other stages of the fuses F11 to F18 is connected to each of one stages of a plurality of resistors R11 to R18 of which each of other stages is connected to a ground. Also, the input/output select means comprises a plurality of n-channel MOSFETs T11 to T26 each including a gate, a drain and a source. The gates of the MOSFETs T11 to T26 are connected to the other stages of the fuses F11 to F18 via the resistors R11 to R18 in a 2 to 1 manner. Namely, each of the other stages of the fuses F11 to F18 is connected to a gate input stage consisting of gates of a pair of the MOSFETs. On the other hand, each of drains and sources of the MOSFETs T11 to T26 is adapted to connect a data bit line DB and a data bit bar line DBB to a spare bit line SB and a spare bit bar line SBB respectively. Therefore, the MOSFETs T11 to T26 turn on/off to connect data bit lines DB and data bit bar lines DBB to the spare bit line SB and spare bit bar line SBB respectively, in response to the control signal $\phi$REDY and states of the fuses F11 to F18.

Referring to FIG. 2b, the decoder means in the column repair circuit in accordance with the present invention is shown to comprise 8 input/output decoders each including a plurality of NOR gates G1 to G128 each having one input terminal, other input terminal and an output terminal and a plurality of n-channel MOSFETs T101 to T356 each having a gate, a drain and a source. Each of the one input terminals of the NOR gates G1 to G128 inputs each of addresses y0 to y15 and the other input terminals thereof inputs one of output signals SIO1 to SIO8 from the input/output select means. Also, the gates of the MOSFETs T101 to T356 are connected to the output terminals of the NOR gates G1 to G128 in a 2 to 1 manner. Namely, each of the output terminals of the NOR gates G1 to G128 is connected to a gate input stage consisting of gates of a pair of the MOSFETs. On the other hand, each of drains and sources of the MOSFETs T101 to T356 is adapted to connect a data bit line DB and a data bit bar line DBB to a bit line B and a bit bar line BB respectively. Therefore, the MOSFETs T11 to T26 turn on/off to connect 8 data bit lines DB and 8 data bit bar lines DBB to 16 bit lines B and 16 bit bar lines BB respectively, in response to output signals from the NOR gates G1 to G128.

The fuses are connected to each of addresses and the control signal φREDY is generated when certain fuse for malfunction address is cut. The control signal φREDY is at a low level when the selected address is normal and the repair is not required, while at a high level when the malfunction address is selected.

Next, the operation of the column repair circuit of the construction in accordance with the present invention as above-stated will be described in detail.

First, when the malfunction address is not present and the repair is required, the control signal φREDY is at a low level and 8 fuses F11 to F18 in the input/output select means all are not cut, thereby enabling the output signals SIO1 to SIO8 from the input/output select means to be at a low level state. Therefore, the spare bit line SB and spare bit bar line SBB are not connected to the normal data bit lines DB1 to DB8 and data bit bar lines DB1B to DB8B, and thus information over the spare bit line SB and spare bit bar line SBB can not be sent out to the normal data bit lines DB1 to DB8 and data bit bar lines DB1B to DB8B. Also, the n-channel MOSFETs T101 to T356 turn on to select the normal bit lines in order to send information over the normal bit lines out to the data bit lines DB and data bit bar lines DBB, in response to the low level output signals SIO1 to SIO8 from the input/output means inputted at the other input terminals of the NOR gates G1 to G128 and the addresses y0 to y15 inputted at the one input terminals of the NOR gates G1 to G128, and thus the output signals from the NOR gates G1 to G128.

When the repair is performed by cutting the fuse for the malfunction address, provided that the malfunction memory cell corresponds to a specified input/output pad I/O1, the fuse f11 in the input/output select means for the specified input/output pad I/O 1 is maintained naturally, while the 7 remaining fuses F12 to F18 are cut. Once the fuses F12 to F18 are cut, the output signals SIO2 to SIO8 from the input/output select means are separated from the input stage adapted for inputting the control signal φREDY and always is at a low level state by the resistors R12 to R18. Therefore, if the input/output selection is performed by the fuse cutting, the spare bit line SB and spare bit bar line SBB are not connected to the data bit lines DB2 to DB8 and data bit bar lines DB2B to DB8B corresponding to the input/output pads I/O2 to I/O8, but connected to the input/output pad I/O1 corresponding to the malfunction memory cell.

When the malfunction address is not selected under the condition that the repair is being performed as mentioned above, another address for normal bit line B and normal bit bar line BB should be selected. Assuming that the malfunction address corresponds to certain decoder D, the output signal SIO1 from the input/output select means corresponding to the malfunction input/output pad is made a low level by the low level control signal φREDY and the decoder D can not be selected, thereby enabling only one address y1 selected from the addresses y1 to y15 to be at a low level state. Therefore, information over the normal bit 2 line B2 and bit 2 bar line B2B can be sent out to the data bit 1 line DB1 and data bit 1 bar line DB1B.

When the malfunction decoder D is selected under the condition that the repair is being performed as mentioned above, the control signal φREDY turns into a high level state enabling the output signal SIO1 from the input/output select means to turn into a high level state in spite of voltage drop by the resistor R1 due to considerably high value of the resistor R1, thereby enabling the malfunction decoder D to be not operated. Therefore, the bit 1 line B1 and bit 1 bar line B1B connected to the malfunction memory cell can not be connected to the data bit 1 line DB1 and data bit 1 bar line DB1B, and thus information over the bit 1 line B1 and bit 1 bar line B1B can not be sent out to the data bit 1 line DB1 and data bit 1 bar line DB1B. On the other hand, the spare bit line SB and spare bit bar line SBB can be connected to the data bit 1 line DB1 and data bit 1 bar line DB1B, and thus information over the spare bit line SB and spare bit bar line SBB can be sent out to the data bit 1 line DB1 and data bit 1 bar line DB1B. Therefore, the malfunction bit 1 line B1 and bit 1 bar line B1B can be replaced by the spare bit line SB and spare bit bar line SBB, and the normal input/output pads I/O2 to I/O8 having the same address are normally decoded by the output signals SIO2 to SIO8 from the input/output select means, which always are at a low level state. In result, the normal information transmission can be performed.

As hereinbefore described, the present invention can provide the column repair circuit for SRAM which is capable of increasing its repair yield by adding the input/output select means enabling input/output selection, without use of fuse. Therefore, in accordance with the present invention, the 8 lines and 8 bit bar lines don't have to be replaced by 8 spare columns and there is no necessity for laser-cutting the fuse in spite of small size of integrated circuits.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A column repair circuit for use in a semiconductor memory including a matrix of regular memory cells and a spare memory cell, comprising:

a plurality of bit lines and bit bar lines;

a plurality of data bus lines and data bus bar lines;

input/output selecting means for:

selecting one of the data bus lines and one of the data bus bar lines corresponding to a faulty regular memory cell in response to an input control signal;

connecting the selected data bus line and the selected data bus bar line to a spare bit line and a spare bit bar line connected to the spare memory cell;

developing an output signal on a control line corresponding to the selected data bus line and the selected data bus bar line, the output signal having a predetermined level; and developing additional output signals on additional control lines, each said additional control lines corresponding to one of the non-selected data bus lines and non-selected data bus bar lines, the additional output signals having a level different than the predetermined level;

wherein said input/output switching means further comprises a plurality of fuse elements, each connected between an input line to which the input control signal is applied and one of a plurality of nodes to which the output signals are applied, all of said plurality of fuse elements, except for the one fuse element corresponding to the selected data bus and line and data bus bar line, being cut to thereby disconnect the input control signal from the remaining non-selected data bus and data bus bar lines;

decoding means for decoding address signals and the output signals provided by the input/output selecting means; and switching means for connecting and disconnecting the bit lines and the bit bar lines to and from the data bus lines and the data bus bar lines respectively in response to decoder output signals from the decoding means.

2. A column repair circuit as recited in claim 1, wherein the input/output selecting means comprises:

a plurality of pairs of transistors, each pair comprising a first transistor connected between the spare bit line and one of the plurality of data bit lines, and a second transistor connected between the spare bit bar line and one of the plurality of data bit bar lines, the gates of each pair of transistors being connected to one of a plurality of nodes; and a plurality of resistors, each connected between one of the nodes and ground;

wherein each of the output signals generated by the input/output selecting means are developed at one of the nodes.

3. A column repair circuit as recited in claim 1, wherein the decoding means comprises a plurality of NOR gates, each of which has a first input to which an address signal is applied, and a second input to which one of the output signals from the input/output selecting means is applied.

4. A column repair circuit as recited in claim 2 wherein the decoding means comprises a plurality of NOR gates, each of which has a first input to which an address signal is applied, and a second input to which one of the output signals from the input/output selecting means is applied.

* * * * *